United States Patent [19]
Wu et al.

[11] Patent Number: 5,950,108
[45] Date of Patent: Sep. 7, 1999

[54] METHOD OF FABRICATING A CONDUCTIVE PLUG

[75] Inventors: Clint Wu, Tai Chung; Horng-Bor Lu; Jenn-Tarng Lin, both of Hsinchu, all of Taiwan

[73] Assignee: United Microelectronics Corp., Taiwan

[21] Appl. No.: 08/768,855

[22] Filed: Dec. 17, 1996

[30] Foreign Application Priority Data

Sep. 7, 1996 [TW] Taiwan ................................... 85110947

[51] Int. Cl.$^6$ ..................................................... H01L 21/44
[52] U.S. Cl. .......................... 438/685; 438/677; 438/686; 438/680; 438/688
[58] Field of Search ...................................... 438/685, 672, 438/680, 650, 688, 798, 677, 686

[56] References Cited

U.S. PATENT DOCUMENTS 5,296,404  3/1994  Akahori et al. .
5,498,768  3/1996  Nishitani et al. .
5,567,987  10/1996  Lee .

*Primary Examiner*—Caridad Everhart
*Attorney, Agent, or Firm*—Pillsbury Madison & Sutro LLP

[57] ABSTRACT

A method of forming a conductive plug is disclosed. A device with a conductive region is formed on a semiconductor substrate. An insulating layer is formed on the semiconductor substrate. The insulating layer is etched to form a contact window which exposes the conductive region of the device. A diffusion barrier layer is formed on the exposed conductive region and the periphery of the contact window. A hydrogen plasma treatment is performed in a reaction chamber; and a conductive material is filled in the contact window, to form the conductive plug.

10 Claims, 2 Drawing Sheets

METHOD OF FABRICATING A CONDUCTIVE PLUG

BACKGROUND OF THE INVENTION

1. Field of the Invention

This invention relates in general to a semiconductor manufacturing process, and more particularly to a method of forming a conductive plug to avoid voids.

2. Description of Related Art

When the density of the integrated circuits increases, the surface of a chip might not provide enough area for interconnects to lay thereon. For the need of interconnects with reduced size of metal-oxide-semiconductor transistors, more than two metal layers become the necessary way for many integrated circuits. For some complicated products, such as microprocessors, even more metal layers are needed to complete the interconnection between individual devices within the microprocessor. Different metal layers are connected by conductive plugs.

Usually, a conductive plug is formed by etching an insulating layer to form a contact hole, then filling a conductive material such as tungsten into the contact hole. Because the adhension between the conductive material and the insulating layer is defficient, a glue/barrier material must be formed between the conductive material and the insulating layer. Commonly used glue/barrier materials include Ti, $TiN_x$ or TiW formed by physical vapor deposition (PVD) or chemical vapor deposition (CVD).

However, the conductive plug of an integrated circuit formed by a conventional process is apt to generate voids. For more clearly understanding the reason, an example is used to explain the conventional process of fabricating the conductive plug of an integrated circuit.

FIG. 1 shows a cross-sectional diagram of a conductive plug of an integrated circuit formed by a conventional manufacturing method. An insulating layer 12, such as borophosphosilicate glass (BPSG) or oxide, is formed on the silicon substrate 10 or on a metal line. After, a portion of the insulating layer 12 is removed by etching to form a contact window 13 which exposes a region 10a of the conductive material by, for example, an anisotropic etching. A diffusion barrier layer 14 is formed on the region 10a of the conductive material and the periphery of the contact window 13, and extended to the upper surface of the insulating layer 12. The diffusion barrier layer 14 can be, for example, a $TiN_x$ layer which prevents diffusion and improves adhension. Then, a conductive material 16, for example, a tungsten, copper or aluminum, is filled into the contact window 13, by PVD or CVD. Since the step coverage is bad, a void 18 is formed therein.

In the above mentioned manufacturing method of the conductive plug of the integrated circuit, a diffusion barrier layer is deposited before the conductive material is filled into the contact window of the insulating layer as a glue/barrier layer. Therefore, the contact window becomes narrower, and deposition sites on the diffusion barrier layer become recessed, which results in voids generating when the conductive material is deposited. As a result, the large voids seriously affect the characteristics of the device such as resistance raising and short circuit.

SUMMARY OF THE INVENTION

It is therefore an object of the present invention to provide a method to form a conductive plug of an integrated circuit by plasma treatment on diffusion barrier layer before the conductive layer is deposited. Therefore, the problem of void can be avoided as the conductive material is later filled According to a preferred embodiment of the invention, an insulating layer is formed on the semiconductor substrate or on a metal line. The insulating layer is etched to form a contact window which exposes the conductive region of the device. A diffusion barrier layer is formed on the exposed conductive region and the periphery of the contact window. A hydrogen plasma treatment is performed in a reaction chamber; and a conductive material for example, tungsten, copper, aluminum or gold, is filled in the contact window, to form the conductive plug.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1:
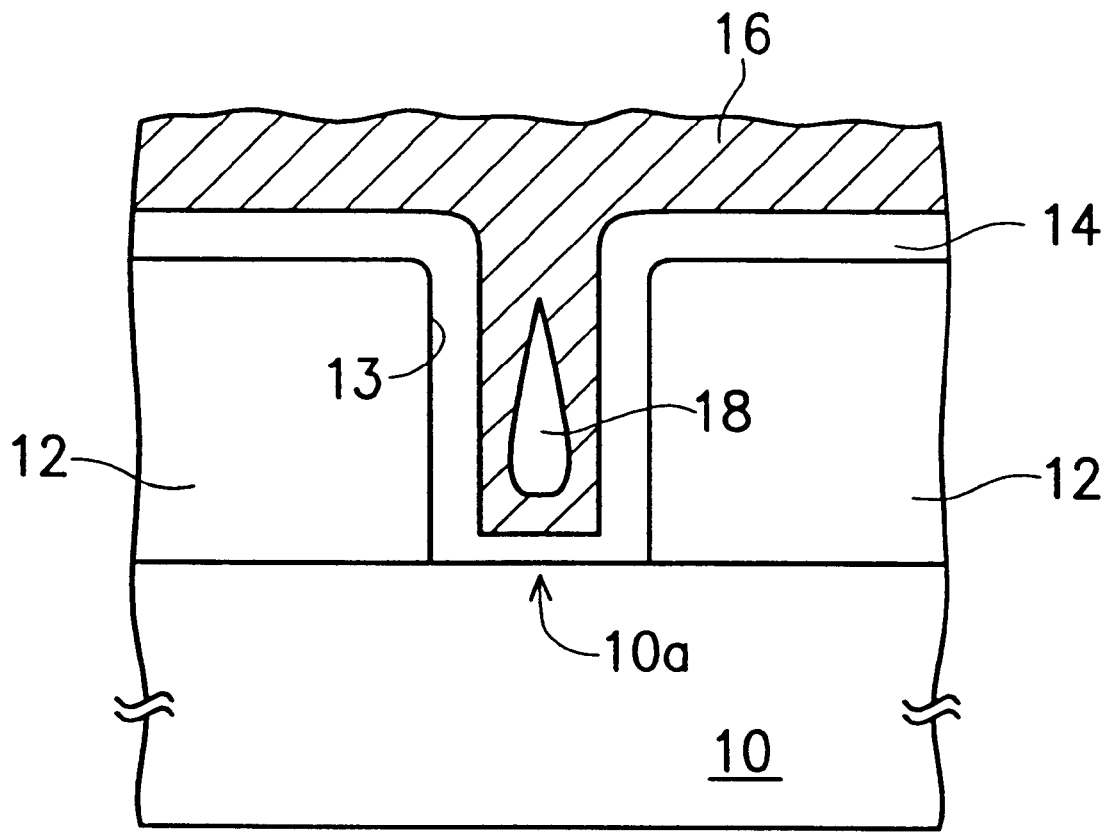
FIG. 1 shows the cross-sectional structure of the conductive plug of an integrated circuit fabricated by a conventional manufacturing method.
Figure 2:
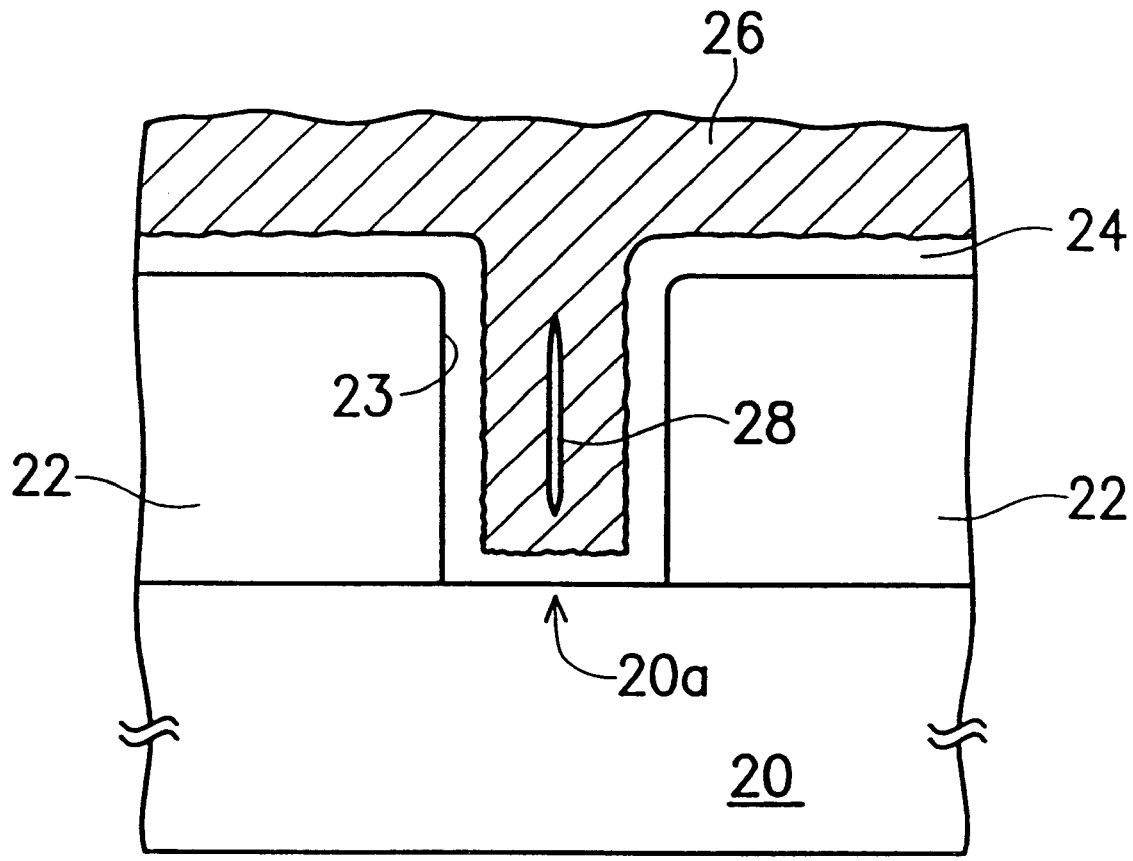
FIG. 2 shows the cross-sectional structure of the conductive plug of an integrated circuit in accordance with a preferred embodiment of the invention.

Referring to FIG. 2, an insulating layer 22, for example, a borophosphosilicate glass or oxide, is formed on a silicon substrate or on a metal line semiconductor 20. Then, a contact window 23 is formed by etching the insulating layer 22 to expose a region 20a of a conductive material, which can be, for example, a source/drain region, a gate or a metal line. A portion of the insulating layer 22 is removed using, for example, a photolithography and anisotropic etching. A diffusion barrier layer 24 is formed on the region 20a of a conductive material, the periphery of the contact window 23 and further onto the upper surface of the insulating layer 22. The diffusion barrier layer 24 can be a composed layer which is formed by physical vapor depositing or chemical vapor depositing a Ti layer and then a $TiN_x$ layer. Alternatively, the diffusion barrier layer 24 can be a tungsten nitride layer or a titanium-tungsten layer. After that, a hydrogen plasma treatment is carried out on to the diffusion barrier layer 24. The hydrogen plasma treatment is performed under the following conditions: a power of less than 3000 watt, a hydrogen input flow rate of less than 3000 sccm, a reaction temperature of less than 1000° C., and a reaction interval of between 10 sec and 10 min, Then, a conductive material 26 such as tungsten, copper, or aluminum is filled into the contact window 23 by, for example, PVD or CVD to form a conductive plug with a tiny void 28.

In the above mentioned embodiment during a hydrogen plasma treatment, the high energy particles increase the density of the diffusion barrier layer, enlarge the contact window and form a number of small caves on the surface of the diffusion barrier layer, which therefore becomes rough. Consequently, the number of the deposition sites increase and a smoother conductive layer can be obtained. Therefore, improving the problem of voids tremendously. Additionally, another merit is that the value of x of TiNx of the diffusion barrier layer (Ti/TiNx) will be reduced so that the contact resistance lowers.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming a conductive plug, comprising the steps of:

providing a semiconductor substrate;

forming a device having a conductive region on the semiconductor substrate;

forming an insulating layer over the semiconductor substrate;

etching the insulating layer to form a contact window which exposes the conductive region of the device;

forming a diffusion barrier layer on the exposed conductive region and the periphery of the contact window, wherein the diffusion barrier layer includes a tungsten nitride layer;

performing a hydrogen plasma treatment on the diffusion barrier layer; and filling a conductive material in the contact window to form the conductive plug.

2. A method of forming a conductive plug, comprising the steps of:

providing a semiconductor substrate;

forming a device having a conductive region on the semiconductor substrate;

forming an insulating layer over the semiconductor substrate;

etching the insulating layer to form a contact window which exposes the conductive region of the device;

forming a diffusion barrier layer on the exposed conductive region and the periphery of the contact window, wherein the diffusion barrier layer includes a titanium-tungsten layer;

performing a hydrogen plasma treatment on the diffusion barrier layer; and filling a conductive material in the contact window to form the conductive plug.

3. A method according to claim 1 or 2, wherein the conductive region is a source/drain region; and the contact window is formed to expose a portion of the source/drain region.

4. A method according to claim 1 or 2, wherein the conductive region is a metal line; and the contact window is etched which exposes a portion of the metal line.

5. A method according to claim 1 or 2, wherein the hydrogen plasma treatment is performed in a reaction chamber and the operation condition includes:

a power of less than 3000 watt;

a hydrogen input flow rate of less than 3000 sccm;

a reaction temperature of less than 1000° C.; and a reaction interval of between 10 sec and 10 min.

6. A method according to claim 1 or 2, wherein the conductive material includes tungsten.

7. A method of forming a conductive plug, comprising the steps of:

providing a semiconductor substrate;

forming a device having a conductive region on the semiconductor substrate;

forming an insulating layer over the semiconductor substrate;

etching the insulating layer to form a contact window which exposes the conductive region of the device;

forming a diffusion barrier layer on the exposed conductive region and the periphery of the contact window, wherein the diffusion barrier layer comprises:

(i) a first layer comprising titanium metal and (ii) a second layer comprising titanium nitride;

performing a hydrogen plasma treatment on the diffusion barrier layer; and filling a conductive material in the contact window to form the conductive plug, wherein the conductive material includes gold.

8. A method according to claim 1 or 2, wherein the conductive material includes aluminum.

9. A method according to claim 1 or 2, wherein the conductive material is formed by chemical vapor deposition.

10. A method according to claim 1 or 2, wherein the conductive material is formed by physical vapor deposition.

* * * * *